US010282630B2

(12) United States Patent
Kadambe et al.

(10) Patent No.: US 10,282,630 B2
(45) Date of Patent: May 7, 2019

(54) MULTI-CHANNEL COMPRESSIVE SENSING-BASED OBJECT RECOGNITION

(71) Applicant: RAYTHEON COMPANY, Waltham, MA (US)

(72) Inventors: Shubha Kadambe, Thousand Oaks, CA (US); Kalin Spariosu, Jr., Thousand Oaks, CA (US); Juan C. Sotelo, Redondo Beach, CA (US)

(73) Assignee: RAYTHEON COMPANY, Waltham, MA (US)

( * ) Notice: Subject to any disclaimer, the term of this patent is extended or adjusted under 35 U.S.C. 154(b) by 108 days.

(21) Appl. No.: 15/453,669

(22) Filed: Mar. 8, 2017

(65) Prior Publication Data

US 2018/0260649 A1    Sep. 13, 2018

(51) Int. Cl.
*G06K 9/32* (2006.01)
*G02B 26/08* (2006.01)
(Continued)

(52) U.S. Cl.
CPC ....... *G06K 9/3241* (2013.01); *G02B 26/0833* (2013.01); *G06K 9/20* (2013.01); *G06K 9/741* (2013.01); *H03M 7/3062* (2013.01); *H04N 5/7458* (2013.01); *H04N 5/919* (2013.01); *G06K 2009/4695* (2013.01)

(58) Field of Classification Search
CPC .. H04N 5/23232; H04N 9/045; H04N 5/3692; H04N 5/919; G06K 9/741; G06K 9/3241; G06K 9/6232; G06K 9/00496; G06K 9/52; G02B 26/0833
See application file for complete search history.

(56) References Cited

U.S. PATENT DOCUMENTS

2002/0057431 A1* 5/2002 Fateley ............ G01J 3/02
                                                    356/330
2012/0038817 A1* 2/2012 McMackin ........ G02B 26/0833
                                                    348/345
(Continued)

OTHER PUBLICATIONS

Fu, "Compressive Spectral Polarization Imaging by a Pixelized Polarizer and Colored Patterned Detector", Journal of the Optical Society of America A, vol. 32, No. 11, Nov. 2015 (pp. 2178-2188).
(Continued)

*Primary Examiner* — Jingge Wu
(74) *Attorney, Agent, or Firm* — Lewis Roca Rothgerber Christie LLP

(57) ABSTRACT

An optical system for capturing an image using compressive sensing includes: a digital micromirror device (DMD) array; an optical lens system; a first optical detector array; a first optical channel for projecting spatial information onto the first detector array; a second optical detector array; a second optical channel; a spectral filter and a polarization filter for projecting spectral and polarization information onto the second detector array; and an image processor to control the DMD array to generate a first and a second set of samples of the image using a sampling rate lower than required by the Shannon-Nyquist sampling theorem, and to reconstruct the image from the samples collected and digitized by the first and second optical detector arrays.

20 Claims, 4 Drawing Sheets

(51) Int. Cl.
*G06K 9/74* (2006.01)
*H04N 5/919* (2006.01)
*G06K 9/20* (2006.01)
*H03M 7/30* (2006.01)
*H04N 5/74* (2006.01)
*G06K 9/46* (2006.01)

(56) References Cited

U.S. PATENT DOCUMENTS

| | | | |
|---|---|---|---|
| 2013/0128042 A1 | 5/2013 | Bridge et al. | |
| 2014/0198236 A1* | 7/2014 | Herman | H04N 5/265 348/239 |
| 2014/0320843 A1* | 10/2014 | Streuber | F41G 7/008 356/4.01 |
| 2015/0003750 A1* | 1/2015 | Bernal | G06T 11/006 382/233 |
| 2015/0029503 A1* | 1/2015 | McMackin | G01J 3/18 356/300 |
| 2015/0042764 A1 | 2/2015 | Xi et al. | |
| 2017/0038259 A1* | 2/2017 | Siegel | G01J 3/51 |
| 2017/0038555 A1* | 2/2017 | Horn | G02B 26/0841 |
| 2017/0339363 A1* | 11/2017 | Hiasa | H04N 5/235 |
| 2018/0160071 A1* | 6/2018 | Ahn | H04N 5/917 |

OTHER PUBLICATIONS

Soldevila, "Single-Pixel Polarimetric Imaging Spectrometer by Compressive Sensing", Applied Physics B: Lasers and Optics, vol. 113, No. 4, May 18, 2013 (pp. 551-558).

International Search Report for corresponding International Application No. PCT/US2018/020774, filed Mar. 2, 2018, International Search Report dated May 24, 2018 and dated May 24, 2018 (5 pgs.).

Written Opinion of the International Searching Authority for corresponding International Application No. PCT/US2018/020774, filed Mar. 2, 2018, Written Opinion of the International Searching Authority dated May 24, 2018 (7 pgs.).

Candès, Emmanuel et al.; "$\ell_1$-Magic: Recovery Sparse Signals via Convex Programming"; California Institute of Technology; Oct. 2005; 19pp.

Duarte, Marco F. et al.; "Single-Pixel Imaging via Compressive Sampling"; IEEE Signal Process. Mag.; vol. 25(2); Mar. 2008; pp. 83-91.

Mahalanobis, A. et al.; "Recent results of medium wave infrared compressive sensing"; Appl. Opt; Dec. 1, 2014; 53(34); pp. 8060-8070 (On Order).

* cited by examiner

MULTI-CHANNEL COMPRESSIVE SENSING-BASED OBJECT RECOGNITION

STATEMENT REGARDING FEDERALLY SPONSORED RESEARCH

This invention disclosure is related to a government contract number N00014-15-C-0066. The U.S. Government has certain rights to this invention.

FIELD OF THE INVENTION

The present invention relates generally to object recognition and, more particularly, to a system and method for multi-channel compressive sensing-based object recognition.

BACKGROUND

Object recognition technology detects and identifies objects (e.g., targets) in an image or a video sequence. Various automatic target recognition (ATR) systems have been designed to obtain accurate classification from features of a target/object extracted from imagery obtained by one or more sensors. Such systems generally attempt to recognize a target and classify a target type from a set of target templates (e.g., stored in a database), created based on models generated from the extracted features from one sensor data and/or fused features (e.g., features from multiple sensors and/or multiple scenes).

In image processing, feature extraction and Regions of Interest (ROI) extraction are two forms of processing employed to automatically recognize objects. The features set includes the relevant information about an object that helps in the classification.

Feature extraction has been widely used in image processing and, object detection and recognition which use different algorithms. Object recognition is the task of classifying an object in an image or a video sequence. In a typical feature-based approach, first a search is used to find the ROIs and then features are extracted from the ROIs. The vector of these extracted features are then compared with the models created for each object type during the training of the classifier. The model of an object type that the extracted features closely matches is declared as the type of object. The more accurate the extracted features are, the more accurate the trained models are and also results of object classification. However, to extract accurate feature from an image, complex processing is required and if the feature extraction and classification are to be performed in real-time, there is a limit to the ability of the systems, especially the hardware, to perform an accurate and real-time feature extraction and classification.

The features are extracted from the digitized image or a video sequence. The important features related to objects of interest are contained in only a small set of digitized data. As a result, most of the digitized data is discarded. To digitize images/video sequences intelligently and thus speed up the feature extraction/object recognition processes, some have recently developed and used compressive sensing (CS) approaches. To reconstruct the images in entirety from the intelligently sampled data need to apply inverse compressive sensing (ICS) techniques. CS and ICS are signal processing techniques to efficiently/intelligently acquire and reconstruct a signal, by finding solutions to underdetermined linear system of equations. These techniques use the sparsity property of a signal to recover the signal from far fewer samples than required by the Shannon-Nyquist sampling theorem (Nyquist rate), by optimization. With no a priori knowledge or assumptions about the signal, it is possible to reconstruct the signal from a series of CS measurements. Compressive sensing takes advantage of the fact that a signal can be sparsely represented in a transformed domain (e.g., when a sinusoidal or cosine signal is transformed to Fourier domain by applying the Fourier transform, it can be represented by just two coefficients.). Many signals can be sparsely represented in a transformed domain and thus contain many coefficients in that domain close to or equal to zero (e.g., Fourier or Wavelet). The approach typically starts with taking a weighted linear combination of samples (compressive measurements) using a set of basis functions that are different from the set of basis functions in which the signal is known to be sparse.

A hardware-based single-pixel camera (SPC) was developed based on the CS mathematics and was used to sample images at much lower than the Nyquist's rate. The SPC directly acquires random samples of a scene without first digitizing pixels/voxels. The camera architecture employs a digital micromirror device (DMD) array to optically apply linear projections of pseudorandom binary patterns on to a scene. These pseudorandom binary patterns turn "on" (1) or "off" (0) the DMD mirrors. The light reflected from all the "on" mirrors are collected by a single photo detector. The photo detector converts light in to voltage. Each voltage value is digitized by an analog to digital converter that is associated with a photo detector. Each digitized value corresponds to a sample or a CS measurement. In this fashion, a SPC measures or samples a scene much fewer times than the number of pixels/voxels in a scene (i.e., under-sampling of the scene image). This camera can be adapted to capture images at wavelengths where conventional charge coupled device (CCD) and CMOS imagers are not capable of capturing, because the SPC relies on a single photo detector.

Some recent approaches utilize a SPC using spatial light modulator—a DMD array to capture the entire scene. These approaches project the scene on to an array of DMDs and control the array with some random patterns. The light reflected from the DMD mirrors are then projected on to a detector. DMDs are controlled with one pattern at a time of the same size as a scene and the detector values were digitized and considered as samples or measurements. Several of these measurements are collected and used in reconstructing a scene using an ICS reconstruction method. However, capturing large scenes with a SPC is difficult, and in some cases, impractical due to its computational complexity. Moreover, matching the size of the patterns used in sampling to the size of an image that is being sampled is difficult because it is not always possible to know the size of a scene a priori.

To improve these approaches, the scene may be divided into a number of blocks of equal fixed sizes, for example, 32×32 pixel blocks. This block-based CS approach is based on generalizing the SPC approach to sense large scenes in smaller blocks using a large array of programmable DMD array. The DMD array is also divided into the same size blocks and is controlled using a pattern of the same size. Light reflected from each block of the DMD is projected on to each detector in a detector array, for example a focal plane array. Pixel values at each detector are collected and digitized. Each of these pixel values is considered as a CS measurement. Each block of DMDs are controlled by the same pattern and pixel values of each block is measured. The measurements from each block of DMDs include spatial information that correspond to one frame of an image.

Different patterns are used per frame and many frames of images are collected. Using measurements across different frames, a scene is reconstructed using an inverse CS reconstruction method.

However, this approach, like the SPC approach, uses only one channel imaging system and thus cannot be used to simultaneously capture different types of information about an image.

SUMMARY

The embodiments of the disclosed invention use a multichannel (for example, a two-channel) imaging system to capture light reflected from the DMDs in multiple (for example, two) angles simultaneously, using multiple (for example, two) sets of detectors, using compressive sensing methodology (i.e., much less than a number of samples required by the Shannon-Nyquist sampling theorem). This way, different types of information about the object (target), for example, spatial, spectral and polarization information, can simultaneously be obtained. This information is then fused together to improve the accuracy of object recognition.

In some embodiments, the disclosed invention is an optical system for capturing an image using compressive sensing. The optical system includes: a digital micromirror device (DMD) array comprising a plurality of micromirrors; an optical lens system for capturing an image and projecting the image onto the DMD array; a first optical detector array; a first optical channel including a first imaging optics for projecting spatial information about the image from the DMD array onto the first detector array; a second optical detector array; a second optical channel including a second imaging optics, a spectral filter and a polarization filter for projecting spectral and polarization information about the image from the DMD array onto the second detector array; and an image processor for controlling on and off states of the micromirrors in the DMD array to direct a first set of samples of the image from the DMD array to the first optical channel and direct a second set of samples of the image from the DMD array to the second optical channel, wherein the image processor further controls the DMD array to generate the first set of samples and the second set of samples of the image using a sampling rate lower than required by the Shannon-Nyquist sampling theorem, and wherein the image processor reconstructs the image from the samples collected and digitized by the first and second optical detector arrays.

In some embodiments, the image processor detects regions of interest (ROIs) of one or more objects of interest in the first image from the reconstructed image, determines sizes and locations of the detected ROIs, and uses the sizes and locations to collect a second set of samples by focusing the system only for ROIs.

In some embodiments, the disclosed invention is a method for capturing an image using compressive sensing. The method includes: capturing an image and projecting the image onto a digital micromirror device (DMD) array comprising a plurality of micromirrors; controlling the DMD array to generate a first set of samples and a second set of samples of the image using a sampling rate lower than that required by the Shannon-Nyquist sampling theorem; projecting spatial information about the first set of samples of the image from the DMD array onto a first detector array through a first optical channel; projecting spectral and polarization information about the second set of samples of the image from the DMD array onto a second detector array through a second optical channel; and reconstructing the images using the samples from the first and second channels.

In some embodiments, projecting spatial information onto the first detector array may include controlling on/off states of the micromirrors in the DMD array to direct the first set of samples of the image to the first optical channel, using Fourier radial basis function. In some embodiments, reconstructing the image may include determining regions of interest (ROIs) of one or more objects of interests in the first image, and reconstructing the images using the samples from the first and second channels and from the reconstructed images of ROIs spatial, spectral and polarization information to recognize objects of similar color and different shape or similar shape and different colors. In some embodiments, reconstructing the image may include reconstructing a first image at low resolution from a sampling rate lower than required by the Shannon-Nyquist sampling theorem that contain spatial information about the image; and determining regions of interest (ROIs) of one or more objects of interests in the first image, wherein images in the ROIs are directed to the first and the second optical channels, and wherein in the first channel, spatial information of the ROIs are collected and in the second channel, spectral and polarization information of the ROIs are collected by projecting the information of the ROIs onto the second detector array.

In some embodiments, the low resolution ROIs obtained from the first channel is resampled using a Hadamard approach and reconstructed using an inverse Hadamard approach to refine the spatial information and obtain high resolution image of the ROIs.

In some embodiments, the disclosed invention is an optical system for capturing an image using compressive sensing. The optical system includes: a digital micromirror device (DMD) array comprising a plurality of micromirrors; means for capturing an image and projecting the image onto the DMD array; a first means for image detection; a first optical channel including a first means for projecting spatial information about the image from the DMD array onto the first means for image detection; a second means for image detection; a second optical channel including a second imaging means, means for capturing spectral information and means for capturing polarization information and for projecting the spectral and polarization information about the image from the DMD array onto the s second means for image detection; means for controlling on/off states of the micromirrors in the DMD array to direct a first sample of the image from the DMD array to the first optical channel and direct a second sample of the image from the DMD array to the second optical channel; means for controlling the DMD array to generate the first set of samples and the second set of samples of the image using a sampling rate lower than required by the Shannon-Nyquist sampling theorem, and means for reconstructing the image by applying inverse compressive sensing based on Hadamard approach.

BRIEF DESCRIPTION OF THE DRAWINGS

These and other features, aspects, and advantages of the disclosed invention will become better understood with regard to the following description, appended claims, and accompanying drawings.

DETAILED DESCRIPTION

In some embodiments, the disclosed invention is a multi-channel compressive sensing (CS) system and method to simultaneously collect spatial, spectral and polarization information about a scene. For example, the spatial information of a scene may be collected in a first optical channel, and spectral or polarization information may be simultaneously collected in a second optical channel. First channel corresponds to the light reflected from "on" state of DMD mirrors and collected by an array of photo detectors—focal plane array (FPA). The second channel corresponds to the light reflected from "off" state of DMD mirrors and collected by a second FPA. In other words, the DMD array reflects complimentary coded images into two channels. The spatial, spectral and polarization information are then utilized to disambiguate objects of different shapes and colors when only few pixels of each object are captured.

This new approach improves various computer-based technologies, such as target recognition in radar systems, pattern recognition, object recognition, facial recognition (to improve for example, security related technologies), photography, magnetic resonance imaging (MRI) to improve computer-based medical technologies, radio astronomy, computed and network tomography, and the like. For example, CS is used in mobile phone camera sensors to allow a reduction in image acquisition energy per image. Similarly, CS is used to improve image reconstruction in holography by increasing the number of voxels that can be inferred from a single hologram; to shorten MRI scanning sessions on conventional hardware; and to improve deconvolving an interferometric image in aperture synthesis in radio astronomy. In network tomography, the disclosed invention improves network delay estimation and network congestion detection that can be obtained by CS, where the network routing matrix is the coefficient matrix.

Figure 1:
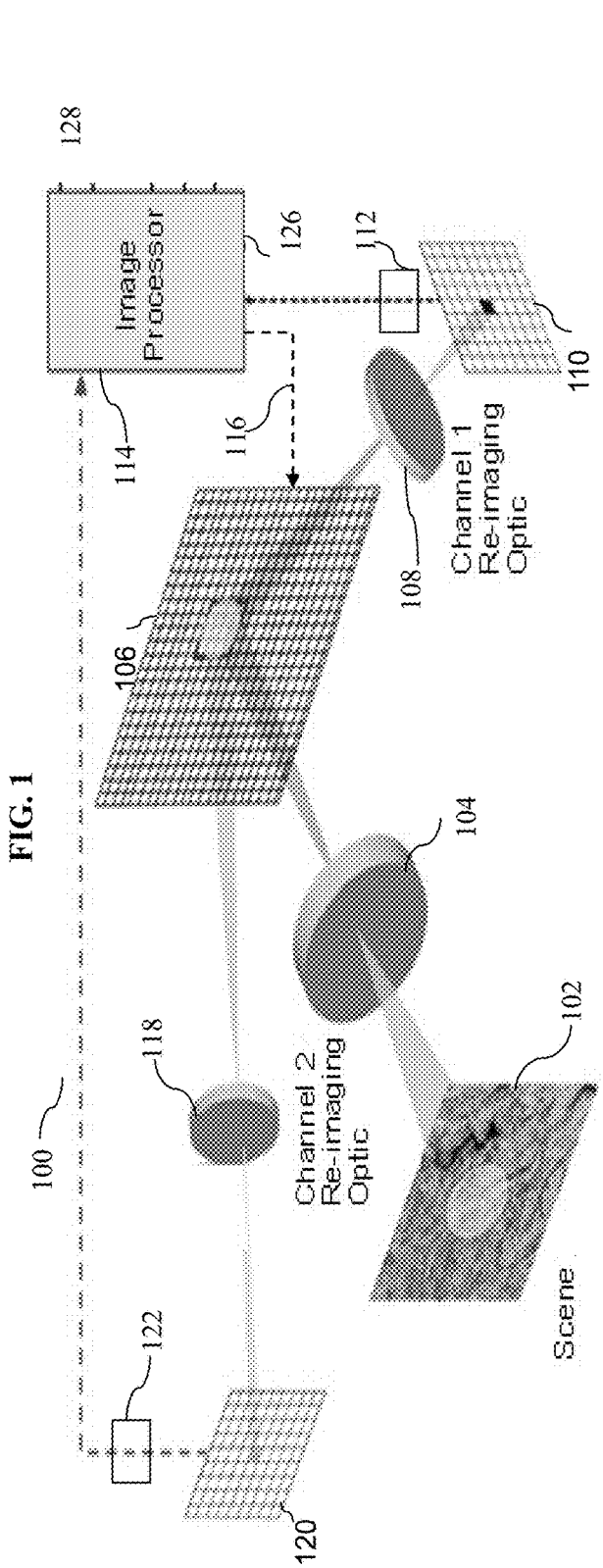
FIG. 1 is an exemplary block diagram of a two-channel compressive sensing (CS) system for simultaneously collecting spatial, spectral and polarization information about a scene, according to some embodiments of the disclosed invention.

FIG. 1 is an exemplary block diagram of a two-channel CS system 100 for simultaneously collecting spatial, spectral and polarization information about a scene, according to some embodiments of the disclosed invention. As shown, a scene 102 including one or more objects is captured by an optical lens system 104, focused and projected into a DMD array 106. In some embodiments, the optical lens system 104 may be a Dual Field-of-view (FOV) telescope.

An image processor 114 controls the "on" and "off" states (angles) of the DMD mirrors within the DMD array 106 so that the projected scene is sampled and directed to a first optical channel including first imaging optics (e.g. Thorlabs™) 108 (e.g., optical devices including lenses and filters) that projects the light from the DMD array 106 onto a first detector array 110, for example a first focal plane (e.g., Teledyne Dalsa™ monochrome FPA). The projected light in this first optical channel includes spatial information about the scene 102, for example, the edges and boundary lines of the objects. The detected light in the first detector array 110 is converted to electrical signals, for example by an optical-to-electrical signal convertor 112, such as a photo diode, digitized by an analog to digital converter (ADC) and input to the image processor 114. In some embodiments, a mode control signal 126 including ROI size and location is input to the image processor 114 for controlling the DMD mirrors. In some embodiments, the output 128 of the image processor includes the compressed image/video, resolution enhanced image ROIs, multispectral ROIs, polarimetric ROIs and high frame rate tracking ROIs In some embodiments, the scene enters through either a narrow field or wide field of view switchable fore optics path. A telecentric projection of the scene is imaged on the DMD array. The DMD array encodes (based on the patterns impinged on them) and reflects the light into the first optical channel, while the compliment of the DMD array encoding is reflected to the second optical channel. Both channels simultaneously detect/samples the coded images.

The DMD mirrors are considered as separate devices and can be controlled with two parameters: 1) pattern time, which is the time a pattern stays on mirrors (i.e., on time), and 2) stabilization time, which is an invalid time. In some embodiments, 8 DMD mirrors are addressed together by one byte. Patterns to control the DMD mirrors can be pre-generated in the form of a matrix. In some embodiments, the image processor 114 utilizes a Fourier radial basis (FRB) function (e.g., represented in the form of a binary matrix) to control the DMD array 106 to project the light onto the first detector array 110. That is, a CS approach based on Fourier radial basis for compressive measurements. It is possible to obtain low resolution images using this approach, however, the approach has an advantage of digitizing a very few samples instead of digitizing the entire image. Using this low resolution image, regions of interest (ROIs) are determined and the resolution in those regions are then improved by recapturing images in those local regions only by applying the Hadamard based algorithm.

Figure 5:
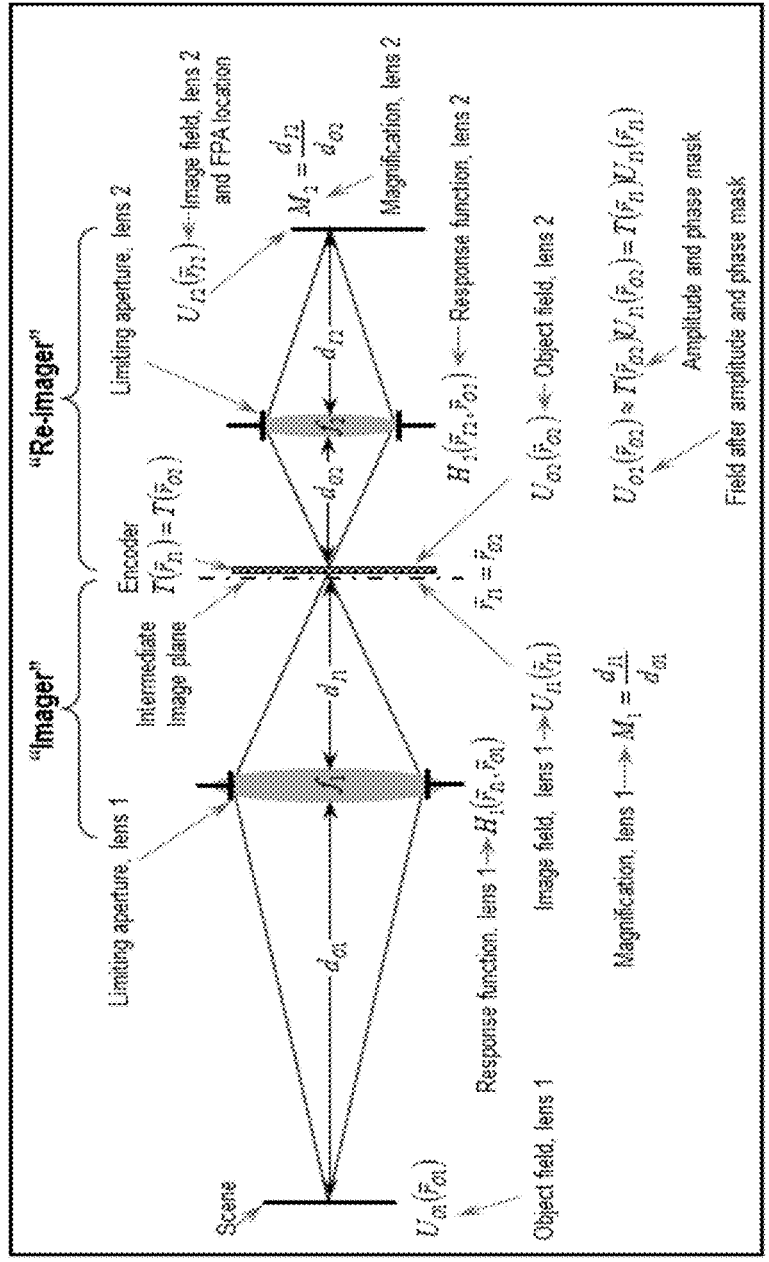
FIG. 5 is a simplified model used to assess elements of the diffraction effects from a DMD array, according to some embodiments of the disclosed invention.

FIG. 5 is a simplified model used to assess elements of the diffraction effects from a DMD array, according to some embodiments of the disclosed invention. In this exemplary figure, exemplar input and output of each stage are included using a bar target image to illustrate how the approach works at each step. The Total Variation (TV) is an iterative approach, which uses the initial estimate of the image which is obtained by applying the inverse 2D Fast Fourier Transform (FFT). The TV approach improves the initial estimate iteratively by estimating the missing Fourier coefficients, reconstructing the image from the estimated coefficients and minimizing the TV. Even though this is an iterative approach, most of the time the minimization of TV is achieved within 8 to 10 iterations. If the initial estimate is satisfactory as would be the case when there are more number of measurements, then the minimization of TV may be achieved within 5 to 6 iterations.

The idea behind getting low resolution image first is to reduce onboard computation and also in general background in an image is not important for many applications. Once the ROIs are determined from the low resolution image, then the high resolution images of only ROIs may be obtained. In some embodiments, for high resolution ROIs, Hadamard approach is applied to both channels. However, in the second channel, a filter for color and polarization is used, resulting in a novel approach of using low/high resolution imaging to reduce onboard computation. In some embodiments, where high resolution ROIs are not needed. However, when there is a significant change in the scene, high resolution ROIs will provide a much more accurate results.

Referring back to FIG. 1, the image processor 114 then reconstructs the scene from these spatially sampled data of the scene 102 to reconstruct the scene 102 and determine the regions of interest (ROIs) of one or more objects of interests in the scene 102. For example, multiple ROIs with different sizes may be selected in the low resolution reconstructed image of the outside scene obtained by applying the CS based on the FRB functions. In some embodiments, standard (known) image processing techniques are applied on this reconstructed image to determine the ROIs. FRB functions are then used to sample images at much lower rate and reconstruct the images. In some embodiments, the image processor reconstructs the image from the samples collected and digitized by the focal plane array. In some embodiments, the image processor detects the ROIs from the reconstructed image and determines the size and location of them. The detected ROIs are then used in collecting second set of samples by directing the system only to the ROIs. For these ROIs, spatial, spectral and polarization information are collected and fused together to accurately classify objects of similar shape and different color and, similar color and different shape.

In some embodiments, for the resolution enhancement in the ROIs, the Hadamard basis patterns are applied to the DMD mirror array. For example, after the ROIs are determined from the reconstructed image using the FRB approach, the image processor 114 resamples the ROIs, using a Hadamard approach and reconstructs the resampled ROI using an inverse Hadamard approach to refine the spatial information for the ROIs and obtain higher resolution image of the ROIs. A Hadamard matrix is a square matrix whose entries are either +1 or −1 and whose rows are mutually orthogonal. In geometric terms, this means that each pair of rows in a Hadamard matrix represents two perpendicular vectors. Hadamard matrix is used in CS for signal processing and for coded aperture spectrometry. Coded aperture masks, such as grids, gratings, or other patterns of materials that are opaque to various wavelengths of light, are used to separate the light wavelengths. By blocking and unblocking light in a known pattern, a coded shadow is cast upon a plane of light detectors. Using image processing techniques, the properties of the original light source can be deduced from the shadow on the light detectors.

As an example, in some embodiments, a ROI is selected from the reconstructed image obtained from the CS method described above. The image for the selected ROI is recaptured by applying, for example, 4×4 Hadamard masks on the DMD array. For generation of the masks, a 16×16 Hadamard matrix may be used where each row of this matrix is converted into a 4×4 matrix. This process is then repeated to create a Hadamard masks matrix of the same size as the DMD array. Using this matrix of Hadamard masks, 16 frames of the image are captured. Using these 16 frames, the resolution enhanced image is obtained by applying the inverse Hadamard transform.

Referring back to FIG. 1, the DMD array 106 is controlled by the image processor 114 to direct the light from the ROIs into both channels including imaging optics 118 and 108 to project the light onto detector arrays 120 and 110, respectively, for example a pair of focal plane arrays. The detected light in both the detector arrays 120 and 110 are converted to electrical signals, for example by an optical-to-electrical signal convertor 122 and 112, such as photo diodes, and input to the image processor 114. The second imaging optics 118 (e.g., optical devices including lenses and/or filters) includes spectral filters (such as color filters), and/or polarization filters. The spectral filters produce color sampled images whereas the polarization filters produce polarized sampled images, in the second channel. In some embodiments, the second imaging optics 118 may include a rotating color filter wheel.

The color filters produce a multispectral image that captures the ROIs images at specific frequencies across the electromagnetic spectrum. The wavelengths are separated by the color filter or by the use of known instruments that are sensitive to particular wavelengths, including those of red, blue and green colors that a human eye is capable of seeing. The polarization filters produce a multi-polarized image that captures the ROIs images at different polarization to better determine the depth and/or contours of the objects in the ROIs. As known, a polarization filter is an optical filter that passes light of a specific polarization and blocks lights of other polarizations.

Figure 4:
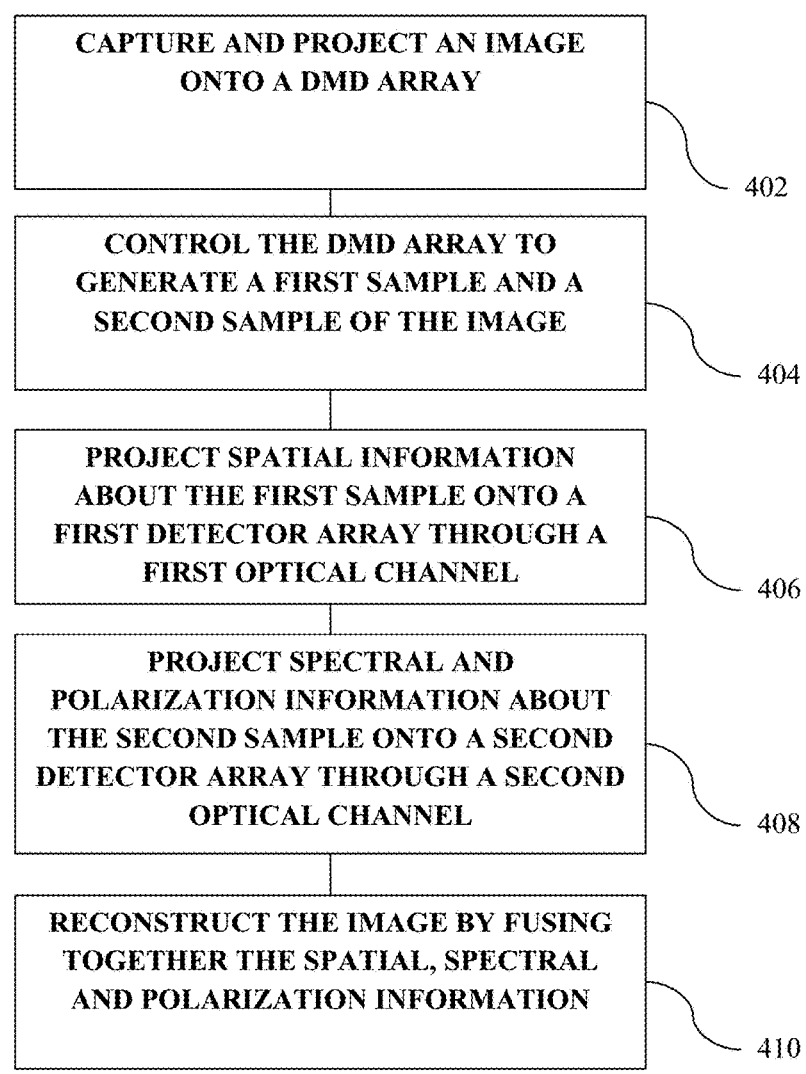
FIG. 4 shows a processing window within the overall sensor FOV depicting the spatial relationships between various functional modes of operation, according to some embodiments of the disclosed invention.

FIG. 4 shows a processing window within the overall sensor FOA depicting the spatial relationships between various functional modes of operation, according to some embodiments of the disclosed invention. Compressive sensing using Fourier radial basis functions is performed over area 302. For resolution enhancement (RE) windows 304, the DMD pixels selected by the Hadamard mask for the current field in the RE window(s) are directed to first channel 1. The DMD pixels for the complement of the current Hadamard mask (the other half of the window area) are directed to the second channel. For multispectral sensing (MS) 306 and polarization sensing (PS) windows 308, all DMD pixels in the multispectral window(s) and polarization window(s) are directed to the second channel. The Compressive sensing 310 is directed to the first channel. In some embodiments, the selected windows for RE, MS, and PS are mutually exclusive.

This way, spatial information from the ROIs are captured in the first channel, and spectral and polarization information about from the ROIs are captured in the second channel, simultaneously by controlling the DMD array. The spatial, spectral and polarization information are then fused together to obtain a more accurate image of the objects, even though only few pixels of those objects are used. For fusion, known approaches, for example, Bayesian approach, r or Dempster-Shafer approach may be used.

For example, the disclosed invention is capable of disambiguating targets of same color but different size, and targets of different colors but the same size from the information from the two channels. Once the objects are disambiguated, they (or their features) may be matched against a database of object features (by the same image processor 114 or a different processor/computer) to recognize the object, for example, as a car, truck, bus, building, an anomaly in a body, etc., using known object recognition techniques.

Figure 3:
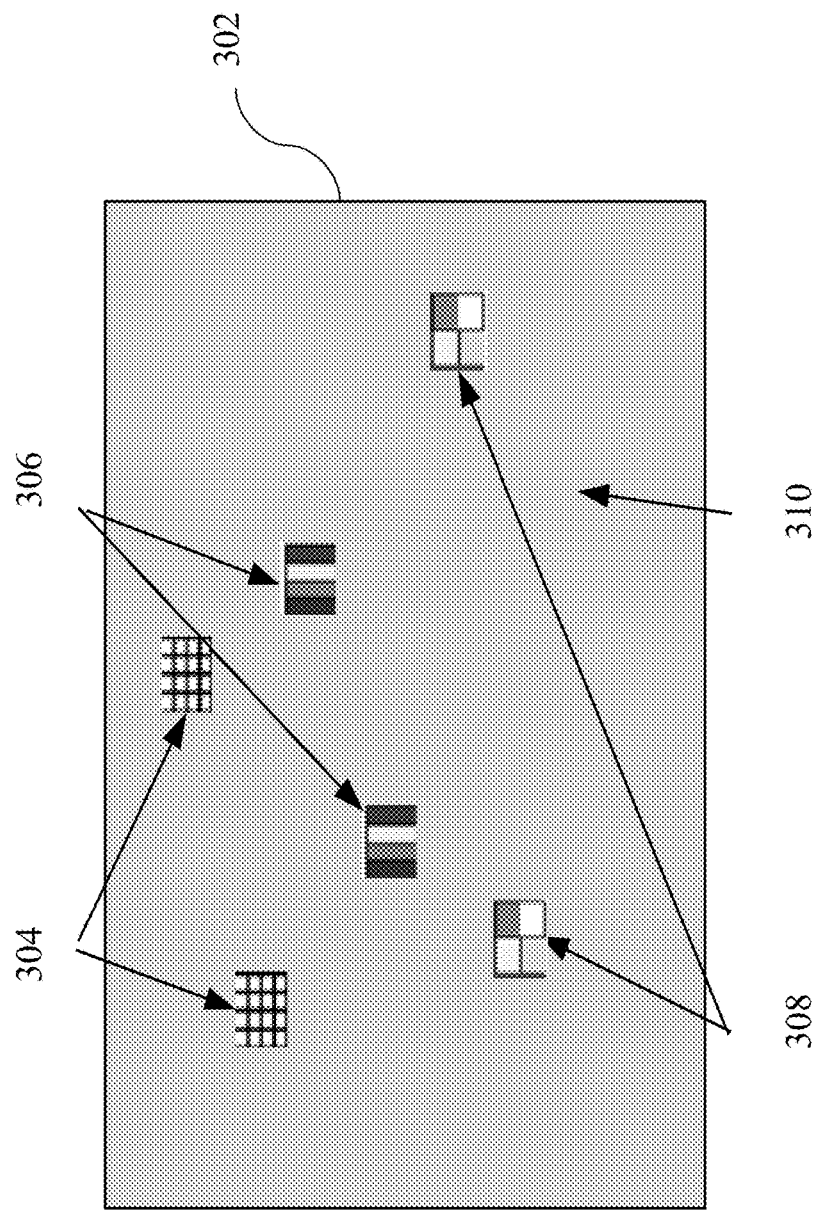
FIG. 3 is an exemplary block diagram of an optical lens system including a spectral filter and a polarization filter, according to some embodiments of the disclosed invention.

As an example, resolution enhancement of the sampled image through the first optical channel for a four-times resolution enhancement is explained. The image enhancement is performed by inverse Hadamard transform, which requires 16 4×4 Hadamard masks (patterns). The Hadamard coefficients are represented by the focal plane array (FPA) data collected over 16 fields in order to apply the inverse transform a vector of 16 coefficients are needed. These are obtained from 16 fields. The enhancement (Hadamard) window location and size is selected by the cue obtained by the compressed sensing of the image. The size and location depends on the ROI. Based on the size and location of the ROIs obtained from the image processing algorithm, a cue is generated to apply the size and location of the enhancement window, as shown in FIG. 3. Each FPA pixel in the selected enhancement window corresponds to a 4×4 DMD pixel area.

One of the 16 4×4 Hammard mask patterns needed the four times resolution enhancement in each direction. The mask patterns are slightly different from a true Hadamard matrix because the DMD array turns the light off for non-selected pixels since general Hadamard matrix has +1s and −1s, −1s, which are changed to 0 here.

An example of four mask patterns for a two-times resolution enhancement is as follows:

four mask patterns:

$$\begin{bmatrix} +1 & +1 \\ +1 & +1 \end{bmatrix}, \begin{bmatrix} +1 & +1 \\ +0 & +0 \end{bmatrix}, \begin{bmatrix} +1 & +0 \\ +1 & +0 \end{bmatrix}, \begin{bmatrix} +1 & +0 \\ +0 & +1 \end{bmatrix}$$

When spatial intensity distribution $$\begin{bmatrix} +a & +b \\ +c & +d \end{bmatrix}$$

applied to 4 successive fields we get:

$$y = \begin{bmatrix} +u \\ +v \\ +w \\ +x \end{bmatrix} = \begin{bmatrix} +1 & +1 & +1 & +1 \\ +1 & +1 & +0 & +0 \\ +1 & +0 & +1 & +0 \\ +1 & +0 & +0 & +1 \end{bmatrix} \begin{bmatrix} +a \\ +b \\ +c \\ +d \end{bmatrix} = T \begin{bmatrix} +a \\ +b \\ +c \\ +d \end{bmatrix} = Tz$$

$z=T^{-1}y$ where $T^{-1}$ is a matrix of +1 and −1 where Z is the input image to be constructed, and y is the output vector (image).

This way, the resolution enhancement is performed by computationally simple addition and subtraction operations.

Figure 2:
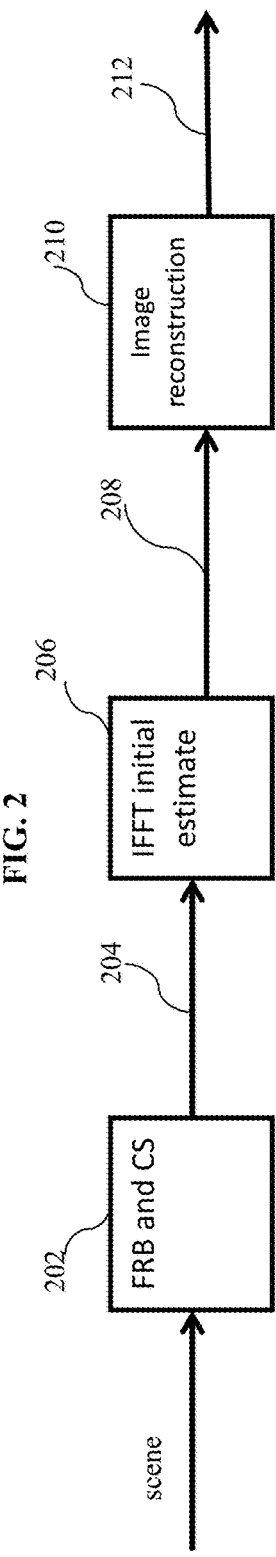
FIG. 2 is a simplified block diagram for compressive sensing using a random Fourier Radial Basis approach, according to some embodiments of the disclosed invention.

FIG. 2 is a simplified block diagram for compressive sensing using a random Fourier Radial Basis approach, according to some embodiments of the disclosed invention. As shown, sparse samples of an object image 204 are obtained by applying Fourier Radial basis (FRB) pattern on the DMD array for CS measurements and Fourier coefficients, in block 202. For example, less than 10% of total scene pixel samples may be used to obtain these sparse samples. A two-dimensional inverse fast Fourier transform (IFFT) is performed on the samples in block 206 (via CS reconstruction) to obtain an initial estimate of the object image 208. In block 210, an image reconstruction is performed on the initial estimate of the object image 208 to produce the reconstructed image 212. In some embodiments, the image reconstruction in block 210 is performed using Total Variation (TV).

FIG. 4 is a simplified process flow diagram for simultaneously collecting spatial, spectral and polarization information about an image from a multi-channel optical system, according to some embodiments of the disclosed invention. As shown in block 402, an image of a scene (including objects of interest) is captured (e.g., by an optical lens system shown in FIG. 1) and projected onto a DMD array. In block 404, the DMD array is controlled (for example, by an image processor) to generate, using compressed sensing, a first set of samples and a second set of samples of the image using a sampling rate lower than the Nyquist rate. In block 406, spatial information about the first set of samples of the image is projected from the DMD array onto a first detector array through a first optical channel, under the control of an image processor.

In block 408, spectral and polarization information about the second sample of the image is captured by, for example, spectral and polarization filters, and projected from the DMD array onto a second detector array through a second optical channel that includes spectral and polarization filters. In some embodiments, the first optical channel corresponds to the light reflected from "on" DMD mirrors and collected by an array of photo detectors, such as FPAs. The second optical channel corresponds to the light reflected from "off" DMD mirrors and collected by a second FPA. In this case, the DMD array reflects complimentary coded images into two detection optical channels. The image is then reconstructed by fusing together the spatial, spectral and polarization information from the first and second optical channels, in block 410. In some embodiments, the image processor reconstructs the image from the samples collected and digitized by the focal plane array. In some embodiments, the image processor detects the ROIs from the reconstructed image and determines the size and location of them. The detected ROIs are then resampled by collecting spatial information in the first channel and spectral and polarization information in the second channel directing the system only to the ROIs. For these ROIs, spatial, spectral and polarization information are collected and fused together to accurately classify objects of similar shape and different color and, similar color and different shape.

In some embodiments, the multi-channel system may be packaged into a Multispectral Targeting System (MTS) turret, in which dual mid-wave infrared (MWIR) sensors and a color filter wheel is used on the spectral channel.

The enclosed Appendix, the entire contents of which is hereby expressly incorporated by reference, provides more detailed mathematical background and proof.

It will be recognized by those skilled in the art that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope of the invention as defined by the appended claims.

The invention claimed is:

1. An optical system for capturing an image using compressive sensing comprising:
    a digital micromirror device (DMD) array comprising a plurality of micromirrors;
    an optical lens system for capturing an image and projecting the image onto the DMD array as a projected image;
    a first optical detector array;
    a first optical channel including a first imaging optics for projecting only spatial information about the projected image from the DMD array onto the first detector array;
    a second optical detector array;
    a second optical channel including a second imaging optics, a spectral filter and a polarization filter for projecting spectral and polarization information about the same projected image from the DMD array onto the second detector array; and
    an image processor for controlling on and off states of the micromirrors in the DMD array to direct a first set of samples of the image from the DMD array to the first optical channel and direct a second set of samples of the image from the DMD array to the second optical channel, wherein the image processor further controls the DMD array to generate the first set of samples and the second set of samples of the image using a sampling rate lower than that required by the Shannon-Nyquist sampling theorem, and wherein the image processor reconstructs the image from the samples collected and digitized by the first and second optical detector arrays.

2. The optical system of claim 1, wherein the first and second optical detector arrays are focal plane arrays.

3. The optical system of claim 1, wherein the image processor detects regions of interest (ROIs) of one or more objects of interest in the reconstructed image, determines sizes and locations of the detected ROIs, and uses the sizes and locations to collect a second set of samples by focusing the system only for ROIs.

4. The optical system of claim 1, wherein the image processor controls the on/off states of the micromirrors in the DMD array to direct the first set of samples of the image to the first optical channel, using a Fourier radial basis function.

5. The optical system of claim 1, wherein the image processor reconstructs a first image from the spatial information about the image, determines regions of interest (ROIs) of one or more objects of interest in the first image, and wherein images in the ROIs are directed to both the first and the second optical channels, wherein in the first channel spatial information of the ROIs are collected and in the second channel, spectral and polarization information of the ROIs are collected by projecting the information of the ROIs onto the second detector array.

6. The optical system of claim 5, wherein the image processor resamples the ROIs using a Hadamard approach and reconstructs the resampled RIOs using an inverse Hadamard approach to refine the spatial, spectral and polarization information of the ROIs and obtain higher resolution images of the ROIs.

7. The optical system of claim 6, wherein the polarization filter produces a multi-polarized image that captures the ROIs images at different polarization to determine the depth and contours of the one or more objects in the ROIs.

8. The optical system of claim 1, further comprising a processor for matching features of the reconstructed image against a database of object features to recognize one or more objects in the image.

9. A method for capturing an image using compressive sensing, the method comprising:
   capturing an image and projecting the image onto a digital micromirror device (DMD) array comprising a plurality of micromirrors, as a projected image;
   controlling the DMD array to generate a first set of samples and a second set of samples of the projected image using a sampling rate lower than that required by the Shannon-Nyquist sampling theorem;
   projecting only spatial information about the first set of samples of the projected image from the DMD array onto a first detector array through a first optical channel;
   projecting spectral and polarization information about the second set of samples of the same projected image from the DMD array onto a second detector array through a second optical channel; and
   reconstructing the image using the samples from the first and second channels.

10. The method of claim 9, wherein projecting spatial information onto the first detector array comprises controlling on/off states of the micromirrors in the DMD array to direct the first set of samples of the image to the first optical channel, using Fourier radial basis function.

11. The method of claim 9, wherein reconstructing the image comprises:
   determining regions of interest (ROIs) of one or more objects of interests in the image, and
   reconstructing the image using the samples from the first and second channels and from the reconstructed images of ROIs spatial, spectral and polarization information to recognize objects of similar color and different shape or similar shape and different colors.

12. The method of claim 9, wherein reconstructing the image comprises:
   reconstructing a first image at low resolution from a sampling rate lower than required by the Shannon-Nyquist sampling theorem that contain spatial information about the image; and
   determining regions of interest (ROIs) of one or more objects of interests in the first image, wherein images in the ROIs are directed to the first and the second optical channels, and wherein in the first channel, spatial information of the ROIs are collected and in the second channel, spectral and polarization information of the ROIs are collected by projecting the information of the ROIs onto the second detector array.

13. The method of claim 12, further comprising:
   resampling the ROIs using a Hadamard approach, and
   reconstructing the resampled ROIs using an inverse Hadamard approach to refine the spatial information for the ROIs and obtain higher resolution image of the ROIs.

14. The method of claim 9, further comprising matching features of the reconstructed image against a database of templates of object features to recognize one or more objects in the image.

15. An optical system for capturing an image using compressive sensing comprising:
   a digital micromirror device (DMD) array comprising a plurality of micromirrors;
   means for capturing an image and projecting the image onto the DMD array;
   a first means for image detection;
   a first optical channel including a first means for projecting spatial information about the image from the DMD array onto the first means for image detection;
   a second means for image detection;
   a second optical channel including a second imaging means, means for capturing spectral information and means for capturing polarization information and for projecting the spectral and polarization information about the image from the DMD array onto the s second means for image detection;
   means for controlling on/off states of the micromirrors in the DMD array to direct a first sample of the image from the DMD array to the first optical channel and direct a second sample of the image from the DMD array to the second optical channel;
   means for controlling the DMD array to generate the first set of samples and the second set of samples of the image using a sampling rate lower than that required by the Shannon-Nyquist sampling theorem,
   means for reconstructing the image by applying inverse compressive sensing based on Hadamard approach; and means for reconstructing a first image from the spatial information about the image, and determining regions of interest (ROIs) of one or more objects of interest in the first image, wherein spatial information in the ROIs is directed to the first channel and spectral and polarization information in the ROIs are directed to the second channel.

16. The optical system of claim 15, further comprising means for disambiguating objects of similar shape but of different colors or similar colors but of different shapes by fusing together features corresponding to spatial, spectral and polarization information of the ROIs.

17. The optical system of claim 15, wherein means for controlling on/off states of the micromirrors in the DMD array utilizes a Fourier radial basis function.

18. The optical system of claim 15, further comprising means for resampling the ROIs using a Hadamard approach and means for reconstructing the resampled RIOs using an inverse Hadamard approach to refine the spatial information for the ROIs and obtain higher resolution image of the ROIs.

19. The optical system of claim 15, further comprising means for matching features of the reconstructed image against a database of models of object features to recognize one or more objects in the image.

20. The optical system of claim 1, wherein the DMD array directs the first set of samples of the image to the first optical channel using a pattern and directs the second set of samples of the image to the second optical channel using a complement of the pattern.

* * * * *